Figure 1:
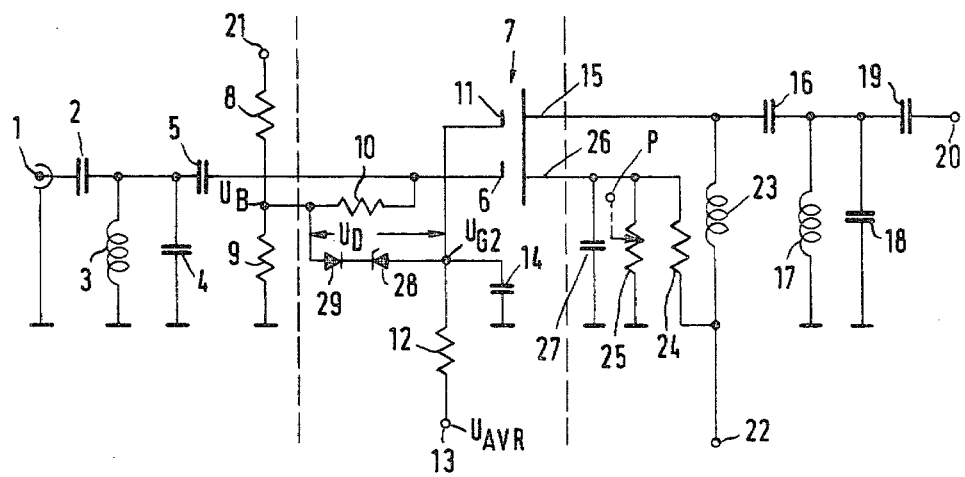

United States Patent [19]  [11] 4,338,572
Schürmann  [45] Jul. 6, 1982

[54] HF AMPLIFIER CIRCUIT

[75] Inventor: Josef H. Schürmann, Oberhummel, Fed. Rep. of Germany

[73] Assignee: Texas Instruments Deutschland GmbH, Freising, Fed. Rep. of Germany

[21] Appl. No.: 131,323

[22] Filed: Mar. 18, 1980

[30] Foreign Application Priority Data

Mar. 23, 1979 [DE] Fed. Rep. of Germany ....... 2911514

[51] Int. Cl.³ ............................................... H03F 3/16
[52] U.S. Cl. ..................................... 330/277; 330/285
[58] Field of Search ............................... 330/277, 285

[56] References Cited

U.S. PATENT DOCUMENTS 4,179,668 12/1979 Schürmann .......................... 330/277
4,275,361 6/1981 Schürmann .......................... 330/277

Primary Examiner—Michael J. Tokar
Attorney, Agent, or Firm—N. Rhys Merrett; Melvin Sharp; Gary C. Honeycutt

[57] ABSTRACT

A high frequency input signal is applied to one gate of a dual gate MES or MIS field effect transistor. A high gain control voltage is applied to the second gate. To reduce the steepness of the main control slope in the pinch-off voltage region of the transistor a diode combination is connected between the second gate and a node of the amplifier circuit which has a fixed potential lying within the gain control voltage range. The conductive threshold of the diode combination is selected such that the combination becomes conductive when the gate control voltage is sufficient to initiate pinch off of the field effect transistor. The diode combination suitably may comprise a forward conduction diode connected a series opposed polarity with a zener diode or, alternatively, may comprise a series chain of forward conduction diodes.

12 Claims, 5 Drawing Figures

HF AMPLIFIER CIRCUIT

The invention relates to an HF amplifier circuit comprising an MES and MIS field-effect transistor having two gate electrodes to which is supplied at the first gate electrode the HF signal to be amplified and at the second gate electrode a gain control voltage, suitably via a high-valued resistor.

In such an amplifier circuit, by means of the voltage supplied to the second gate electrode the gain of the field-effect transistor can be influenced. It is found that the control steepness, i.e. the gain variation with respect to the control voltage variation, increases very greatly when the value of the control voltage comes into the region of the pinch-off voltage of the field-effect transistor. The pinch-off voltage is the voltage at a gate electrode at which the drain current practically ceases to flow. Thus, if the control voltage reaches a value in the region of this pinch-off voltage even very small control voltage changes produce large gain changes; this is however undesirable because the result is a pronounced non-linearity of the dependence between the control voltage and the gain variation.

With the aid of the invention an HF amplifier circuit of the type outlined at the beginning is to be further developed so that the control steepness is reduced at a control voltage value in the region of the pinch-off voltage.

According to the invention, this problem is solved in that between the second gate electrode and a circuit point with fixed potential lying in the control voltage range a diode combination with conduction threshold value is inserted.

When in the circuit according to the invention the difference between the control voltage and the fixed potential exceeds the conduction threshold voltage of the diode combination the latter becomes conductive and as a result the control voltage change is no longer fully active at the second gate electrode. The control voltage change thus no longer effects the same gain change which it would produce without the use of the diode combination.

For fixing the conduction threshold value in simple manner, according to a preferred embodiment of the invention the diode combination consists of a zener diode whose anode is connected to the second gate electrode and of a normal diode connected in series therewith with opposite poling According to a further development of the invention this diode combination may consist of a diode chain. This diode chain has a conduction threshold value which is equal to the sum of the threshold voltages of the individual diodes of the chain.

Advantageously, according to the invention the circuit point is the tap of a voltage divider used for producing the bias at the first gate electrode.

The amplifier circuit according to the invention may however also be designed so that the circuit point is the source electrode of the field-effect transistor.

In a further advantageous development of the invention the diode combination is integrated together with the field-effect transistor on the same semiconductor substrate.

Preferably, the conduction threshold value of the diode combination may be chosen according to the invention so that it is equal to the difference between the fixed potential at the circuit point and the voltage value at which the pinch-off of the field-effect transistor occurs.

Figure 2:
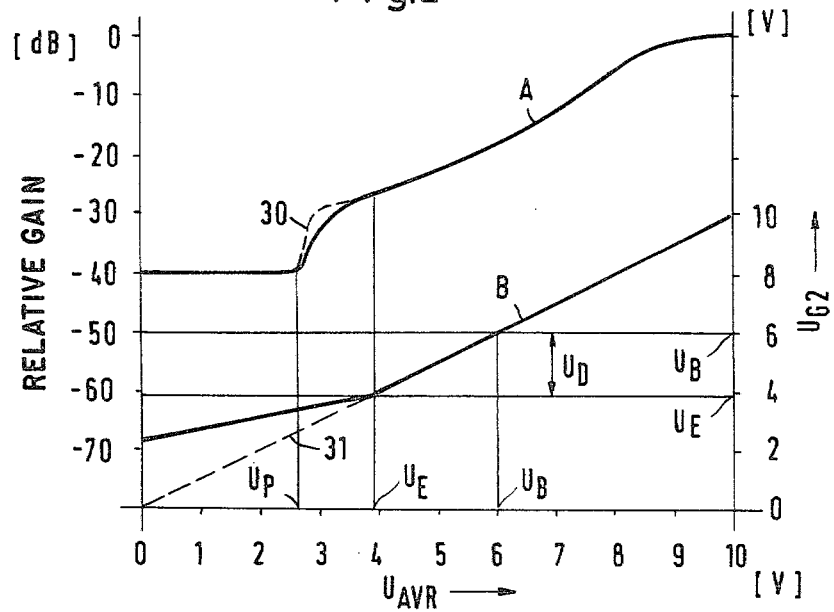
Figure 3:
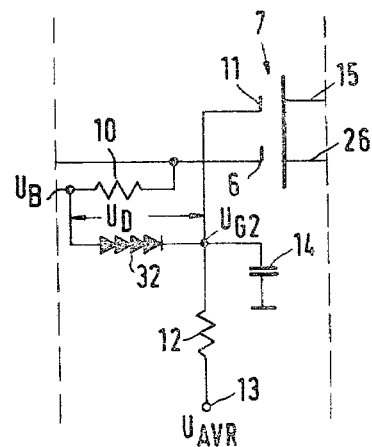
Figure 4:
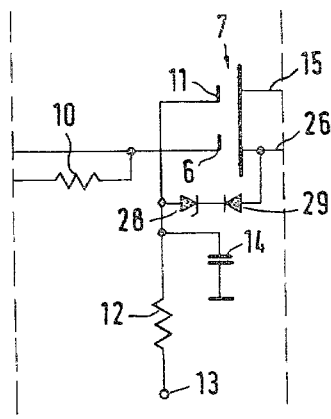
Figure 5:
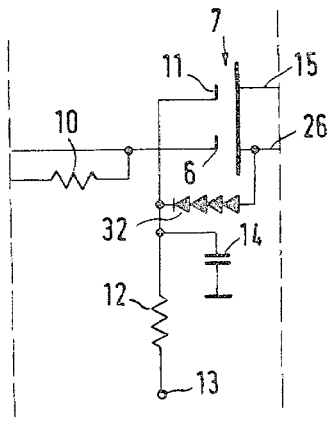

The invention will be explained by way of example with the aid of the drawings, wherein:

FIG. 1 is a circuit diagram of the HF amplifier according to the invention,

FIG. 2 is a diagram for explaining the relationship between the gain control voltage and the relative gain, FIG. 3 is a fragment of the circuit diagram of FIG. 1 with a modification according to a further example of embodiment of the invention, FIG. 4 is a fragment of the circuit of FIG. 1 with a modification according to a further example of embodiment of the invention and FIG. 5 is a fragment of the circuit of FIG. 1 with a modification according to a further example of embodiment of the invention.

The HF amplifer circuit illustrated in FIG. 1 comprises an input jack 1 for receiving the HF signal to be amplified. The HF signal is supplied via a coupling capacitor 2, a parallel resonance circuit comprising a coil 3 and a capacitor 4, and a further coupling capacitor 5 to the first gate electrode 6 of a dual-gate MIS field-effect transistor 7 of the depletion type. The field-effect transistor may alternatively be an MES field-effect transistor in which each gate electrode is isolated from the channel zone by a Schottky barrier layer defined between a suitable metal contact and the semiconductor surface overlying the corresponding channel zone. A fixed bias $U_B$ is produced with the aid of a voltage divider comprising two resistors 8 and 9. The bias tapped from the connection point of the two resistors 8 and 9 is fed to the gate electrode 6 via a resistor 10 serving for HF decoupling.

The MIS field-effect transistor 7 comprises a second gate electrode 11 to which a gain control voltage applied to a terminal 13 is supplied via a resistor 12. By means of a capacitor 14 a second gate electrode 11 is grounded for high frequencies.

The amplified HF signal may be taken from the drain electrode 15 of the MIS field-effect transistor 7. It is supplied via a coupling capacitor 16, a parallel resonance circuit comprising a coil 17 and a capacitor 18, and a further coupling capacitor 19 to an output terminal 20.

The positive supply voltage is applied to a terminal 21 which is connected to the resistor 8 of the voltage divider for producing the bias of the gate electrode 6. This voltage divider comprising the two resistors 8 and 9 thus lies between the positive supply voltage and ground. The supply voltage is also applied to a terminal 22 which is connected via a choke 23 to the drain electrode 15. Between the terminal 22 and ground there is a voltage divider comprising two resistors 24 and 25 whose tap is connected to the source electrode 26 of the field-effect transistor 7. The source electrode 26 is also connected for high frequencies to ground with the aid of a capacitor 27. By means of the voltage divider comprising the resistors 24 and 25 the source electrode 26 has a fixed positive bias and as a result the gain of the field-effect transistor can be controlled with an exclusively positive control voltage at the input 13. Thus, to obtain complete suppression of the drain current with the aid of the control voltage no negative voltage is necessary as would be required without the increasing of the source voltage to a fixed bias value.

As apparent from FIG. 1, between the second gate electrode and the tap of the voltage divider comprising the resistors 8 and 9 a diode combination of a zener diode 28 and a normal diode 29 is inserted. These two diodes are connected with opposite poling in series, the anode of the zener diode 28 being connected to the gate electrode 11 and the anode of the normal diode 29 to the tap of the voltage divider comprising the resistors 8 and 9. The cathodes of the two diodes are directly connected together.

The mode of operation of the HF amplifier described will now be explained with reference to the diagram illustrated in FIG. 2. In this diagram, the gain control voltage applied to the terminal 13 is plotted along the abscissa. The left ordinate gives the relative gain, which is illustrated as curve A, and the right ordinate gives the voltage occurring at the gate electrode 11, represented as curve B. For the explanation it will be assumed that the supply voltage at the terminals 21 and 22 has a value of about 12 V. It is assumed further that the resistors 8 and 9 each have the same resistance value so that a voltage $U_B$ of about 6 V results at the tap of the voltage divider formed by said resistors. This voltage, which forms the bias of the gate electrode 6, is so chosen that an optimum gain by the field-effect transistor results. As apparent from the diagram of FIG. 2 the relative gain has its maximum value when the control voltage has the highest value, which in the present example is 10 V. The channel forming with this control voltage beneath the gate electrode in the transistor substrate is fully conductive for this control voltage value and thus has no influence on the drain current. The control voltage can vary between the value providing maximum gain and the value providing minimum gain. In the example of FIG. 2 the control voltage range is the range between 0 and 10 volts.

The voltage $U_{G2}$ at the gate electrode 11 is, according to the curve B in the diagram of FIG. 2, identical to the gain control voltage $U_{AVR}$ from the maximum value downwards until a voltage $U_E$ is reached at which the pinch-off of the channel in the field-effect transistor 7 controlled by the gate electrode 11 starts. Without the diode combination indicated in FIG. 1 of the zener diode 28 and the normal diode 29 the voltage $U_{G2}$ would further follow the gain control voltage $U_{AVR}$ linearly, as indicated by the dashed line 31.

In the region between the maximum value of the gain control voltage $U_{AVR}$ and the voltage $U_B$ there is also a relatively linear control, as shown by the curve A in the diagram of FIG. 2. After reaching the pinch-off voltage $U_P$ at which the drain current in the field-effect transistor 7 ceases to flow, the gain control voltage $U_{AVR}$ no longer has a control effect. Without the diode combination of the zener diode 28 and the normal diode 29, in the region between the voltage $U_E$ and the voltage $U_P$ the steepness of the curve A of the relative gain would greatly increase, i.e. even a small change of the control voltage would produce a pronounced change of the relative gain. In FIG. 2 this is indicated by the dashed line 30. Measurements have shown that in the region of the curve A indicated by the dashed line 30 without using the diode combination a control steepness of about 30 to 40 dB/V results.

In the circuit of FIG. 1, the conduction threshold value $U_D$ of the diode combination, which is made up of the zener voltage of the zener diode and the forward voltage of the normal diode, usually 0.7 V, is so selected that it is equal to the difference between the bias $U_B$ and the voltage $U_E$ at which the pinch-off of the field-effect transistor occurs. This gives the following effect: As long as the gain control voltage $U_{AVR}$ is greater than the voltage $U_B$ the zener diode 28 is not effective and the normal diode 29 is biased in the reverse direction so that the fixed bias produced by the voltage divider cannot reach the gate electrode 11. As soon as the gain control voltage reaches a value smaller than the voltage $U_B$ the zener diode 28 becomes non-conductive and the diode 29 becomes conductive. On further reduction of the gain control voltage to the voltage $U_E$ the breakdown voltage of the zener diode 28 is reached so that it becomes conductive. The fact that the voltage at the gate electrode 11 after breakdown of the diode 28 is not simply clamped to a fixed voltage equal to the difference $U_D$ between the fixed bias $U_B$ and the voltage $U_E$ is due to the non-ideal breakdown characteristic of the zener diode. When the control voltage is further reduced after the breakdown of the zener diode the current flowing therethrough also varies. Due to the non-ideal characteristic, the voltage drop occurring thereat changes so that the control voltage change which the current change in the zener diode produces still effects a change in the gate voltage $U_{G2}$ but no longer with the full value of the change, being reduced by the voltage drop at the resistor 12. The gate voltage $U_{G2}$ thus does not have exactly the value of the gain control voltage but is increased by the voltage drop at the resistor 12. In the diagram of FIG. 2 this is apparent from the fact that the curve B on reduction of the gain control voltage $U_{AVR}$ beneath the value $U_E$ has a flatter path than would be the case without using the diode combination. The flatter path of the curve B gives a correspondingly flatter path of the curve A of the gain control in the region between the two voltages $U_E$ and $U_P$. This flatter path of the curve A in said region has practically the effect that a given gain voltage change produces a smaller gain change than would be the case without using the diode combination. It has been shown by measurement that when using the circuit arrangement described the control steepness in the critical region could be reduced to about 10 to 12 dB/V.

In FIGS. 3, 4 and 5 various other embodiments of the portions of the HF amplifier circuit between the two vertical dashed lines are illustrated. The remainder of the circuit is in each case identical to the circuit of FIG. 1 and consequently has not been drawn again in FIG. 3 to 5.

In the embodiment of FIG. 3 the diode combination is formed by a diode chain 32 which consists of a plurality of diodes connected in series. The conduction threshold value depends in this circuit on the fact that the diode chain does not become conductive until the voltage difference occurring thereat is greater than the sum of the threshold voltages of the individual diodes. In the case of silicon diodes the threshold voltage is of course 0.7 V so that in FIG. 3 the conduction threshold value is 2.8 V. The diode chain 32 thus becomes conductive when the control voltage at the terminal 13 is 2.8 V below the voltage at the tap of the voltage divider comprising the resistors 8 and 9. The diode chain 32 also has a non-ideal characteristic so that no clamping of the voltage $U_{G2}$ to a fixed value occurs. When, after the diode chain 32 has become conductive, the control voltage at the terminal 13 drops further, i.e. the voltage difference between the control voltage $U_{AVR}$ and the voltage $U_B$ becomes greater, the voltage drop occurring at the diode chain also varies so that the gate voltage $U_{G2}$ also changes accordingly.

What is claimed is:

1. HF amplifier circuit comprising an MES or MIS field-effect transistor having first and second gate electrodes; means for applying at the first gate electrode an HF signal to be amplified; means for applying at the second gate electrode a gain control voltage within a selected control voltage range; and diode means having a predetermined conduction threshold voltage connected between said second gate electrode and a node of said amplifier circuit, said node having a fixed potential lying in said control voltage range such that said diode combination becomes conductive when a value of the gain control voltage is reached at which pinch-off of said field-effect transistor commences.

2. Circuit according to claim 1, wherein said diode means comprises a zener diode having an anode connected to the second gate electrode and a forward conduction diode connected in series opposed polarity with said zener diode.

3. Circuit according to claim 1, wherein said diode means comprises a series chain of diodes having a cathode connected to said second gate electrode.

4. Circuit according to claim 1, wherein said amplifier circuit node is a tap of voltage divider means for producing a bias at said first gate electrode.

5. Circuit according to claim 1, wherein said amplifier circuit node is the source electrode of said field-effect transistor.

6. Circuit according to claim 1, wherein said amplifier circuit node is a tap on source resistor means for said field-effect transistor.

7. Circuit according to claim 1, wherein said diode means is integrated together with said field-effect transistor on a common semiconductor substrate.

8. Circuit according to claim 1, wherein said conduction threshold voltage of the diode means is equal to the difference between the fixed potential at said amplifier circuit node and the pinch-off voltage of the field-effect transistor.

9. Broadcast receiver including a high frequency amplifier circuit having input means for receiving high frequency broadcast signals; a field effect transistor having first and second gate electrodes, a source electrode and a drain electrode; means for biasing the first gate electrode at a selected d.c. level; a.c. coupling means for coupling high frequency signals from said input means to said first gate electrode; means for applying to the second gate electrode a gain control voltage within a defined control voltage range including a voltage effective to result in operation of said transistor in a drain-current pinch-off region of the operating characteristic of said transistor; means operably connected to said second gate electrode for reducing the gain control voltage when the transistor operates in said drain current pinch-off region, and means for extracting a high frequency output signal from the source-drain path of said transistor.

10. Broadcast receiver according to claim 9, wherein said gain control voltage reduction means includes a series diode chain connected between said second gate electrode and a node of said amplifier circuits having a fixed potential lying in said control voltage range.

11. Broadcast receiver according to claim 10, wherein the series diode chain has a conduction threshold voltage equal to the difference between the fixed potential at said amplifier circuit node and the pinch-off voltage value of said transistor.

12. Broadcast receiver according to claim 9, wherein said control voltage reduction means includes a zener diode having connected to said second gate electrode and a forward conduction diode connected in series opposed polarity with said zener diode.

* * * * *